(12) United States Patent
Tanizawa

(10) Patent No.: US 6,657,234 B1
(45) Date of Patent: Dec. 2, 2003

(54) NITRIDE SEMICONDUCTOR DEVICE

(75) Inventor: Koji Tanizawa, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 09/762,281

(22) PCT Filed: Jun. 7, 2000

(86) PCT No.: PCT/JP00/03677

§ 371 (c)(1), (2), (4) Date: Mar. 16, 2001

(87) PCT Pub. No.: WO00/76004

PCT Pub. Date: Dec. 14, 2000

(30) Foreign Application Priority Data

Jun. 7, 1999 (JP) .......................... 11-159482

(51) Int. Cl.[7] .................. H01L 27/15; H01L 29/06; H01L 33/00; H01L 29/12
(52) U.S. Cl. .................. 257/79; 257/103; 257/613; 257/615; 257/13; 257/14; 257/15; 257/94; 257/96
(58) Field of Search ................ 257/13–15, 79, 257/103, 613, 615, 94, 96

(56) References Cited

U.S. PATENT DOCUMENTS

| | | | | |
|---|---|---|---|---|
| 5,578,839 A | * | 11/1996 | Nakamura et al. | 257/96 |
| 5,684,309 A | * | 11/1997 | McIntosh et al. | 257/191 |
| 5,945,689 A | | 8/1999 | Koike et al. | |
| 6,153,894 A | * | 11/2000 | Udagawa | 257/96 |
| 6,163,038 A | * | 12/2000 | Chen et al. | 257/103 |
| 6,288,416 B1 | * | 9/2001 | Koike et al. | 257/94 |

FOREIGN PATENT DOCUMENTS

| | | |
|---|---|---|
| JP | 5-206513 | 8/1993 |
| JP | 08-111558 | 4/1996 |
| JP | 08-139407 | 5/1996 |
| JP | 9-36423 | 2/1997 |
| JP | 09-232666 | 9/1997 |
| JP | 09-232675 | 9/1997 |
| JP | 10-12969 | 1/1998 |
| JP | 10-4210 | 6/1998 |
| JP | 10-163523 | 6/1998 |
| JP | 10-256601 | 9/1998 |

OTHER PUBLICATIONS

A. Salvador et al., "Properties of a Si doped as GaN/AlGaN single quantum well" Applied Physics Letter, vol. 67, No. 22, Nov. 1995, pp. 3322–3324.

* cited by examiner

Primary Examiner—Jerome Jackson
Assistant Examiner—Joseph Nguyen
(74) Attorney, Agent, or Firm—Volentine Francos, PLLC

(57) ABSTRACT

An nitride semiconductor device for the improvement of lower operational voltage or increased emitting output, comprises an active layer comprising quantum well layer or layers and barrier layer or layers between n-type nitride. semiconductor layers and p-type nitride semiconductor layers, wherein said quantum layer in said active layer comprises $In_xGa_{1-x}N$ ($0<x<1$) having a peak wavelength of 450 to 540 nm and said active layer comprises laminating layers of 9 to 13, in which at most 3 layers from the side of said n-type nitride semiconductor layers are doped with an n-type impurity selected from the group consisting of Si, Ge and Sn in a range of $5 \times 10^{16}$ to $2 \times 10^{18}/cm^3$.

31 Claims, 2 Drawing Sheets

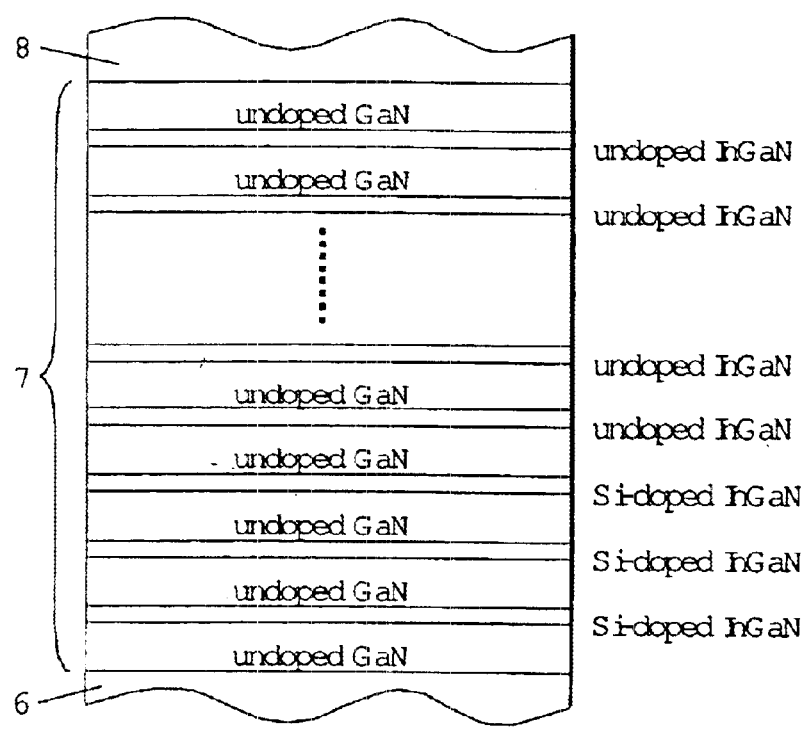

NITRIDE SEMICONDUCTOR DEVICE

BACKGROUND OF THE INVENTION

This invention relates to a nitride semiconductor device used for light emitting devices such as a light emitting diode (LED) and a laser diode (LD), light receiving devices such as a solar cell and a light sensor and electronic devices such as a transistor and a power device, especially relates to an improved quantum well structure light emitting diode having an emitting peak wave length in a range of 450 to 540 nm wherein a loared operating voltage and an increased output can be obtained.

Nitride semiconductors have been used to make high bright and pure green and blue LEDs for full color displays, traffic signals and light sources for image scanner and so on. These LED devices are made of laminated structures which basically comprise a GaN buffer layer formed on a sapphire substrate, a n-type GaN contact layer doped with Si, an single-quantum-well (SQW) or multi-quantum-well (MQW) active layer comprising InGaN, a p-type AlGaN clad layer doped with Mg and a p-type GaN contact layer doped with Mg. The SQW blue laser having a peak wave length of 470 nm has shown a very superior characteristic such as the output of 2.5 mW and the external quantum efficiency of 5% at 20 mA, whereas the MQW has shown the output of 5 mW and the external quantum efficiency of 9.1% at 20 mW. Further, the SQW blue. laser having a peak wave length of 520 nm has shown the output of 2.2 mW and the external quantum efficiency of 4.3% at 20 mA, whereas the MQW has shown the output of 3 mW and the external quantum efficiency of 6.3% at 20 mW.

The MQW are expected to get an improved device characteristic such as higher outputs as compared to the SQW because the MQW can emit the light efficiently at a small current due to a plurality of mini-band structures. As a typical LED device having the MQW active layer for getting a good efficiency and output, Japanese Patent Kokai Hei 10-135514 discloses a nitride semiconductor light emitting device which comprises a MQW light emitting layer comprising laminated structures of undoped GaN barrier layers and undoped InGaN quantum well layers between clad layers having a wider band gap than that of the barrier layer. However, in order to improve the output of the blue green LED having a longer peak wavelength, there is proposed the increased number of layers in the MQW structure. The forward voltage Vf becomes higher depending on the layer number of MQW, resulting in such problems as the higher forward voltage Vf and the lowered emitting output.

SUMMARY OF THE INVENTION

The object of the present invention is to provide a nitride semiconductor device having an active layer of a quantum well structure with large number of layers and relatively low forward voltage, especially with an improved emitting efficiency and a higher emitting output.

As a result of focused research for luminous phenomenon in the light emitting diode having a Multi Quantum Well (MQW) structure between n-type semiconductor layers and p-type semiconductor layers, there was found that recombination of electrons and holes in the MQW active layer mainly happen in a quantum well layer or layers close or proximate to the p-type nitride semiconductor layers and rarely happen in a quantum well layer close or proximate to the n-type nitride semiconductor layers. That is, the quantum well layer near to the n-type nitride semiconductor layers can hardly function as the emitting layer. After that, there was found that, when an n-type impurity is doped into the quantum well layer close to the n-type nitride semiconductor layers, the carrier density thereof increases, so that the forward voltage can be lowered and the emitting efficiency can be improved. The present invention was completed on the basis of the above finding. According to a first aspect of the present invention, there is provided a nitride semiconductor device which comprises an active layer containing an n-type impurity and comprising a quantum well layer or layers and a barrier layer or layers between n-type nitride semiconductor layers and p-type nitride semiconductor layers, wherein at least one of said barrier layers and said quantum well layers at the proximate side in said active layer to said n-type nitride semiconductor layers is dope with n-type impurity. In this invention, the donor can be additionally supplied into the active layer from the n-type nitride semiconductor layers, so that a higher output can be obtained. In a preferred embodiment of the present invention, the layers to be doped with the n-type impurity should be determined according to the following formula (1). Because, if the number of the doped layers are beyond the determined number, a good output can not be obtained due to the deterioration of crystal quality. If said active layer is a MQW having (i) laminated layers, then at least one of 1st to j-th layers counting from the side proximate to said n-type nitride semiconductor layers is doped with n-type impurity, wherein j'=i/6 +2, where i is an integer of at least 4, and wherein j is the integer portion of j'.

In the present invention, the layer doped with the n-type impurity means the layer intentionally doped with the n-type impurity, preferably in a range of $5 \times 10^{16}$ to $2 \times 10^{18}/cm^3$. In a case that the layer contains the n-type impurity in a range of $5 \times 10^{16}$ to $2 \times 10^{18}/cm^3$ due to the diffusion of the n-type impurity from the neighboring layer and the contamination from original materials and CVD devices, the unintentional doping layer also belongs to the doped layer.

Generally, the barrier layer and/or the quantum well layer is preferably an undoped layer for functioning as the emitting layer. In the present invention, the undoped layer means a layer not containing the n-type impurity of more than $5 \times 10^{16}/cm^3$.

In a preferred embodiment of the present nitride semiconductor device, the barrier layer and/or the quantum well layer at the distal side to said n-type semiconductor layers may be not doped with n-type impurity. Therefore, in the preferred nitride semiconductor device having the active layer of a SQW, the quantum well layer and the barrier layer at the proximate side to said p-type semiconductor layers are not doped with n-type impurity. On the other hand, in a case of MQW the proximate layers to said n-type semiconductor layers may be doped with n-type impurity whereas said proximate layers to said p-type semiconductor layers may not be doped with n-type impurity.

In a preferred case, said active layer comprises 9 to 15 layers, at most 4, preferably at most 3 layers of which from said n-type semiconductor layers are doped with n-type impurity.

The above structure may be applied to the active layer comprises InxGa1–xN (0<x<1) suited to the emitting light of 450 to 540 nm, preferably 490 to 510 nm.

In a preferred embodiment, the n-type impurity may be selected from the group consisting of Si, Ge and Sn. The n-type impurity content of the active layer may be lower than that of said n-type semiconductor layers. In the other case, the n-type impurity content of the active layer may decrease depending on distance from said n-type semiconductor layers. Generally, the n-type impurity content of the active layer may be in a range of $5 \times 10^{16}$ to $2 \times 10^{18}/\text{cm}^3$. Preferably the n-type impurity content of the barrier layer and/or the quantum well layer in the active layer may be in a range of $5 \times 10^{16}$ to $2 \times 10^{18}/\text{cm}^3$.

In a typical case, the n-type impurity content of the barrier layer is in a range of $5 \times 10^{16}$ to $2 \times 10^{18}/\text{cm}^3$, whereas the n-type impurity content of the quantum well layer is in a range of $5 \times 10^{16}$ to $2 \times 10^{18}/\text{cm}^3$ and lower than that of the barrier layer. In another typical case, the n-type impurity content of the barrier layer is in a range of $5 \times 10^{16}$ to $2 \times 10^{18}/\text{cm}^3$, whereas the n-type impurity content of the quantum well layer in the active layer is less than $5 \times 10^{16}$ to $2 \times 10^{18}/\text{cm}^3$ and lower than that of said barrier layer.

In the present invention, for the improvement of higher output, the thickness of the barrier layer or quantum well layer close or proximate to said n-type semiconductor layers is larger than that of said barrier layer or quantum well layer close or proximate to said p-type semiconductor layers. For the improvement of low operational voltage, the thickness of the barrier layer or quantum well layer close or proximate to the n-type semiconductor layers is smaller than that of the barrier layer or quantum well layer close or proximate to the p-type semiconductor layers.

The inventive MQW structure can be preferably applied to a blue-green light emitting diode. Therefore, according to a second aspect of the present invention, there can be provided a nitride semiconductor emitting device which comprises an active layer comprising quantum well layer or layers and barrier layer or layers between n-type nitride semiconductor layers and p-type nitride semiconductor layers, wherein the quantum layer in the active layer comprises $In_xGa1-xN$ ($0<x<1$) having a peak wavelength of 450 to 540 nm and the active layer comprises laminating layers of 9 to 13, in which at most 3 layers from the side of the n-type nitride semiconductor layers are doped with an n-type impurity selected from the group consisting of Si, Ge and Sn at a range of $5 \times 10^6$ to $2 \times 10^{18}/\text{cm}^3$.

In a typical embodiment of the present invention, the thickness of the barrier layer or quantum well layer close or proximate to the n-type semiconductor layers is larger than that of the barrier layer or quantum well layer close or proximate to the p-type semiconductor layers. In another typical embodiment of the present invention, the thickness of the barrier layer or quantum well layer close or proximate to the n-type semiconductor layers is smaller than that of the barrier layer or quantum well layer close or proximate to the p-type semiconductor layers.

In a preferred embodiment, the inventive MQW active layer can be preferably applied to the light emitting diode having the quantum well layer of $In_xGa1-xN$ ($0<x<1$) having a peak wavelength of 490 to 510 nm. In this case, the barrier layer may comprise $In_yGa1-yN$ ($0 \leq y<1$, $y<x$).

In a more preferred embodiment, the active layer comprising an MQW of $In_xGa1-xN$ ($0<x<1$)/$In_yGa1-yN$ ($0 \leq y<1$, $y<x$) lamination may be formed on an n-type multi-layer, which may be selected from the group consisting of a buffer super lattice layer undoped with n-type impurity and comprising $In_zGa1-zN$ ($0<z<1$)/GaN lamination or $Al_wGa1-wN$ ($0<w<1$)/ GaN lamination. In this case, the GaN layer of the buffer super lattice layer may have a thickness of less than 70 Å whereas the barrier layer of the active layer may have a thickness of more than 70 Å.

In another preferred embodiment, the multi-layer may be doped with n-impurity and comprises lamination of GaN layer and a layer selected from the group consisting of $In_zGa1-zN$ ($0<z<1$, $z<y$) layer having a larger band gap energy than that of the quantum well layer and $Al_wGa_wN$ ($0<w<1$) layer. In this case, the n-type impurity for doping into the active layer and the n-type clad layer is preferably Si and the Si content of the active layer may be in a range of $5 \times 10^{16}$ to $2 \times 10^{18}/\text{cm}^3$ whereas the Si content of said n-clad layer may be in a range of more than $5 \times 10^{17}/\text{cm}^3$ and larger than that of the active layer.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein:

FIG. 2 is a schematic cross-sectional view of an example of a MQW structure of the LED device shown in FIG. 1.

DETAILED DESCRIPTION OF THE PREFERRED EMBODIMENTS

Figure 1:
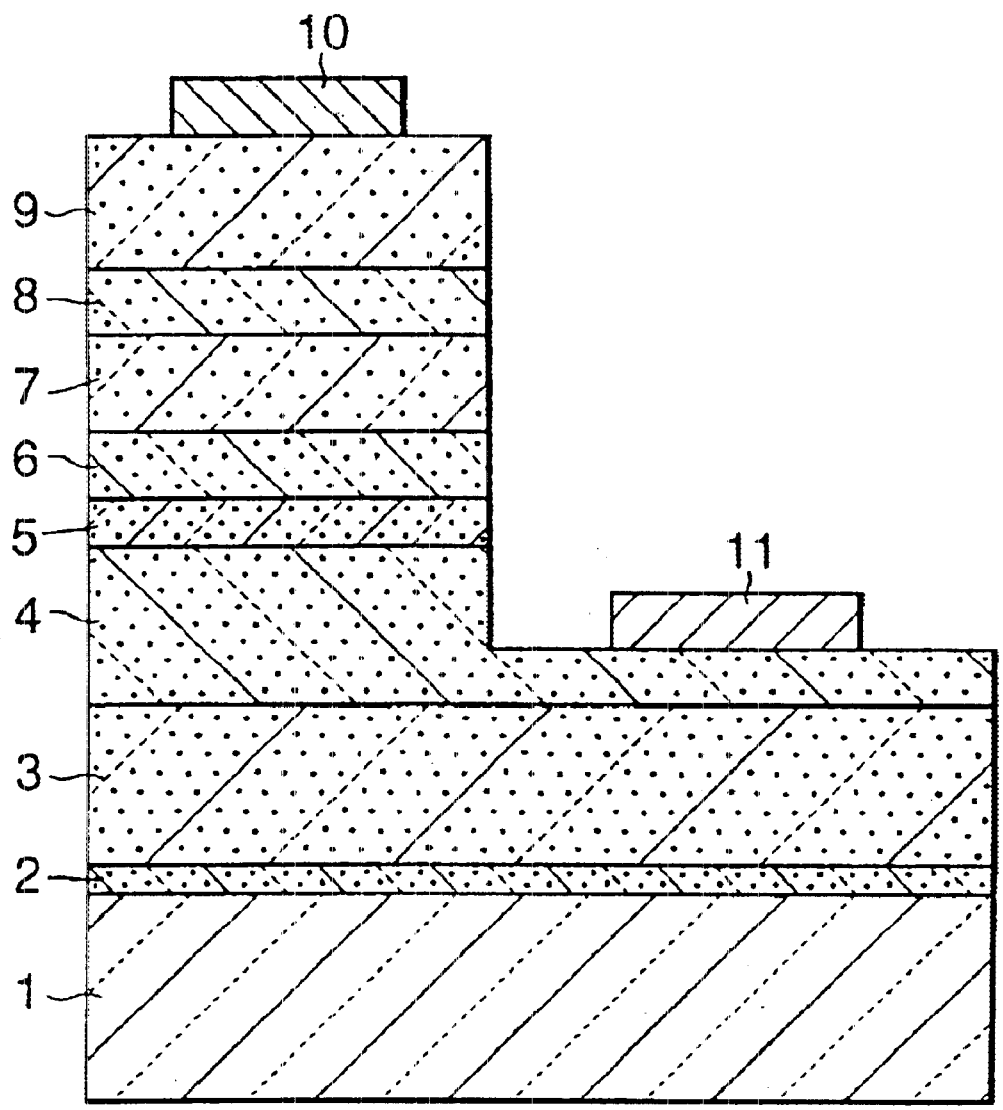
FIG. 1 is a schematic cross-sectional view of the preferred embodiment of the LED device of the present invention.

This application is based on application No.11-159482 filed Jun. 7, 1999 in Japan, the content of which is incorporated hereto by reference.

FIG. 1 is a schematic cross-sectional view showing the structure of the nitride semiconductor device according to an embodiment of the present invention. The present invention will be described in detail with reference to FIG. 1.

FIG. 1 shows an nitride semiconductor device in such a structure that a buffer layer 2, an undoped GaN layer 3, an n-type contact layer 4 made of Si doped GaN, a first n-type multi-layered film 5, a second n-type multi-layered film 6, an active layer 7 in the multi-quantum-well structure made of InGaN/GaN a p-type multi-layered film 8 and a p-type contact layer 9 made of Mg doped GaN are laminated sequentially on the substrate 1. The composition of each layer and/or the number of laminated layers are different between the n-type multi-layered film 6 and the p-type multi-layered film 8.

In an embodiment of the present invention, the active layer is in the multi-quantum well structure having a multi-layered structure formed by laminating well layers and barrier layers sequentially. The minimum layered structure can be a three-layered structure which has a barrier layer and two well layers provided on either side of the barrier layer or which has a well layer and two barrier layers provided on either side of the well layer. In the multi-quantum-well structure, the two outermost layers are constituted by well layers or barrier layers, respectively, but one outermost layer may be a well layer and the other outer most layer may be a barrier layer. In the multi-quantum-well layer, the last layer in the p-type layer region may be a barrier layer or a well layer.

For the active layer in such a multi-quantum-well structure, both well and barrier layers may be made of nitride semiconductor containing indium and gallium (preferably InGaN). But the well layer may be made of nitride semiconductor containing indium and gallium (preferably InGaN) or GaN, and the barrier layer may be made of, for example, AlN or GaN. For example, the well layer of the active layer in the multi-quantum-well structure is made of a nitride semiconductor containing at least In, preferably $In_xGa_{1-x}N$ ($0 \leq X < 1$). While the barrier layer may be made of a nitride semiconductor having a band gap energy larger than that of the well layer, preferably $In_yGa_{1-Y}N$ ($0 \leq Y < 1$, X>Y) or $Al_zGa_{1-Z}N$ ($0 < Z < 0.5$)

An n-type impurity doped in the active layer may be selected from IV Group elements such as Si, Ge, Sn, S, O, Ti or Zr, or VI Group elements, preferably may be Si Ge or Sn, most preferably Si.

According to the present invention, the concentration of the n-type impurity in the active layer is larger in the n-type layer region than in p-type layer region. More preferably, the layers which meet the above-mentioned equation (1) on the basis of the layer close to the n-type nitride semiconductor layer are doped with an n-type impurity. The expression that the concentration of the n-type impurity in the n-type layer region is larger than in the p-type layer region means, for example, the case that in the active layer in the multi-quantum-well structure formed by laminating the well layer and the barrier layer alternately, in 11 layers in all, six layers in the n-type layer region are doped with an n-type impurity and the remaining 5 layers in the p-type layer region are not doped with an n-type impurity. Also it means that in such a case, only well layers among 6 layers in the n-type layer region are doped with an n-type impurity. The number of layers and doped layers may be varied provided that the n-type layer region is doped with an n-type impurity in the larger concentration.

According to the present invention, the total thickness of the active layer is not particularly specified. But the total thickness is the sum of the thickness of well layers and barrier layers and is, for example, 500 to 5000 angstroms, preferably, 1000 to 3000 angstroms. The total thickness of the active layer is preferably within the above-mentioned range in the term of the light output power and the time required for the crystal growth of the active layer.

The single thickness of the barrier layer which constitutes the multi-quantum-well structure of the active layer is 70 to 500 angstroms, preferably 100 to 300 angstroms. The single thickness of the barrier layer is preferably within the above-mentioned range, with the result that the photoelectric transfer efficiency is enhanced and Vf and the leak current are decreased.

The single thickness of the well layer of the active layer is not more than 100 angstroms, preferably not more than 70 angstroms, more preferably not more than 50 angstroms. The lower limit of the single thickness of the well layer is not particularly specified, and it is preferably not less than 10 angstroms. The single thickness of the well layer is preferably within the above-mentioned range, with the result that the light output power is increased and the half band width of the emission spectrum is decreased.

The concentration of an n-type impurity doped in the active layer is controlled to be not more than the amount of Si doped in the n-type contact layer, preferably $5 \times 10^{16}/cm^3$ to $1 \times 10^{19}/cm^3$, more preferably $5 \times 10^{16}/cm^3$ to $5 \times 10^{18}/cm^3$, most preferably $5 \times 10^{16}/cm^3$ to $2 \times 10^{18}/cm^3$, more preferably. The concentration of an n-type impurity is preferably within the above-mentioned range, with the result that Vf can be decreased without the decrease of the photoelectric transfer efficiency and the increase of the leak current in the I–V characteristics.

According to the present invention, the device structure except the active layer is not particularly specified and various structures can be utilized. The concrete embodiment of the device structure may include, for example, one that will be described in the following examples. The electrode is also not particularly specified and various electrodes can be utilized.

EXAMPLES

The examples according to an embodiment of the present invention will be described in the following part. But the present invention is not limited to those examples.

Example 1

Example 1 will be described with reference to FIG. 1 and FIG. 2.
(Substrate 1)

A C-face sapphire substrate 1 is set in the MOVPE reactor and the temperature of the substrate is increased to 1050° C. with hydrogen flown to clean the substrate. The substrate 1 may be a R-face or A-face sapphire substrate, an insulting substrate like spinel ($MgAl_2O_3$), or a semiconductor substrate such as SiC (including 6H, 4H and 3C), Si, ZnO, GaAs, GaN and the like.
(Buffer Layer 2)

Subsequently, the temperature is decreased to 510° C. A buffer layer 2 made of GaN is grown to a thickness of about 200 angstroms on the substrate 1 using hydrogen as a carrier gas and ammonia ($NH_3$) and trimethylgallium (TMG) as a source gas. The first buffer layer 2 which is grown at the low temperature may be omitted depending on the kind of the substrate and the growth method. The buffer layer may be made of AlGaN having a small mixing proportion of Al.
(First Undoped GaN Layer 3)

After growing the buffer layer 2, only TMG is stopped and the temperature is increased to 1050° C . At 1050° C., likewise using ammonia and TMG as a source gas, a first undoped GaN layer 3 is grown to the thickness of 1 $\mu$m.
(n-Type Contact Layer 4)

Subsequently, at 1050° C., likewise using TMG and ammonia as a source gas and silane gas as an impurity gas, an n-type contact layer made of GaN doped with Si to $3 \times 10^{19}/cm^3$ is grown to the thickness of 2.165 $\mu$m.
(n-Type First Multi-layered Film 5)

Next, only silane gas is stopped and at 1050° C., using TMG and ammonia gas, a lower layer 5a made of undoped GaN is grown to the thickness of 3000 angstroms. Subsequently, at the same temperature, the silane gas is added and a middle layer 5b made of GaN doped with Si to $4.5 \times 10^{18}/cm^3$ is grown to the thickness of 300 angstroms. Further, subsequently, the only silane gas is stopped and an upper layer 5c made of undoped GaN is grown to the thickness of 50 angstroms. Thus, an n-type multi-layered film 5 which is constituted by 3 layers and had a total thickness of 3350 angstroms is grown.
(n-Type Second Multi-layered Film 6)

Next, at the same temperature, a second nitride semiconductor layer made of undoped GaN is grown to the thickness of 40 angstroms. Then, at 800° C., using TMG, TMI and ammonia, a first nitride semiconductor layer made of undoped $In_{0.13}Ga_{0.87}N$ is grown to the thickness of 20 angstroms. These operations are repeated to laminate the layers in the order of the second layer+the first layer, in 10 layers, respectively. Finally, the second nitride semiconductor layer made of GaN is grown to the thickness of 40 angstroms. Thus, an n-type second multi-layered film 6 in the super lattice structure is grown to the thickness of 640 angstroms.
(Active Layer 7)

Next, a barrier layer made of undoped GaN is grown to. the thickness of 200 angstroms using ammonia. Subsequently, at 800° C., a well layer made of $In_{0.3}Ga_{0.7}D_7N$ doped with Si to $5 \times 10^{17}/cm^3$ is grown to the thickness of 30 angstroms using TMG, TMI, ammonia and silane gas. Further, a barrier layer made of undoped GaN is grown to the thickness of 200 angstroms. Subsequently, at the same temperature, a well layer made of undoped $In_{0.3}Ga_{0.7}N$ doped with Si to $5\times10^{17}/cm^3$ is grown to the thickness of 30 angstroms. Then, the barrier layers and the well layers are laminated in the order of the barrier+well+barrier+ . . . +barrier layer. Thus, as illustrated in FIG. 2, 16 undoped barrier layers and 15 well layers among which the initial 3 layers are doped with Si and the remaining 12 layers are undoped are laminated alternately, in 31 layers in all, with the result that the active layer 7 in the multi-quantum-well structure having a total thickness of 3650 angstroms is obtained.

(p-Type Multi-layered Film 8)

Next, the temperature is raised to 1050° C. A third nitride semiconductor layer made of $Al_{0.2}Ga_{0.8}N$ doped with Mg to $5\times10^{19}/cm^3$ is grown to the thickness of 40 angstroms using TMG, TMA, ammonia and Cp2Mg (cyclopentadienyl magnesium). Subsequently, at 800° C., a fourth nitride semiconductor layer made of $In_{0.02}Ga_{0.98}N$ doped with Mg to $5\times10^{19}/cm^3$ is grown to the thickness of 25 angstroms using TMG, TMI, ammonia and Cp2Mg. These operations are repeated to laminate layers in the order of the third+fourth layer, in 5 layers, respectively. Finally the third nitride semiconductor layer is grown to the thickness of 40 angstroms. Thus, a p-type multi-layered film 8 in the super lattice structure having a total thickness of 365 angstroms is formed.

(p-Side Optical Waveguide Layer 11)

Next, Cp2Mg and TMA are stopped and 1050° C., a p-side optical waveguide layer 11 made of undoped GaN and having a band gap energy lower than that of the p-side capping layer 10 is grown to the thickness of 0.1 μm.

This p-side optical guide layer 8 is undoped, that is, intentionally undoped, but due to the diffusion of Mg from the adjacent p-side first cladding layer and p-side second cladding layer, the real concentration of Mg is $5\times10^{16}/cm^3$, resulting in the layer doped with Mg.

(p-Side Contact Layer 9)

Subsequently, at 1050° C., a p-type contact layer 8 made of p-type GaN doped with Mg to $1\times10^{20}/cm^3$ is grown to the thickness of 700 angstroms using TMG, ammonia and Cp2Mg.

After the reaction is completed, the temperature is decreased to room temperature. Additionally, the wafer is annealed at 700° C. in nitrogen atmosphere within the reactor, so as to make the p-type layer less resistive.

After annealing, the wafer is removed out of the reactor. A mask of a predetermined shape is formed on the surface of the uppermost p-type contact layer 9 and etching is conducted from the p-type contact layer with the RIE (reactive ion etching) apparatus, to expose the surface of the n-type contact layer 4, as shown in FIG. 1.

After etching, a translucent p-electrode 10 containing Ni and Au and having a thickness of 200 angstroms is formed on the almost entire surface of the uppermost p-type contact layer. And an n-electrode 11 containing W and Al is formed on the surface of the n-type contact layer 4 which had been exposed by etching, resulting in a LED device.

For the resulting LED device, the blue emission at a wavelength of 470 nm is observed at the forward voltage of 20 mA. Vf is 3.4V and the light output power is 6.5 mW.

Example 2

The LED device is fabricated in the same manner as in Example 1, except that the active layer 7 is formed in the following manner.

(Active Layer 7)

A barrier layer made of undoped GaN is grown to the thickness of 200 angstroms using TMG and ammonia. Subsequently, at 800° C., a well layer made of $In_{0.03}Ga_{0.7}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of $In_{0.3}Ga_{0.7}N$ doped with Si to $5\times10^{17}/cm^3$ is grown to the thickness of 30 angstroms. Then, the barrier layers and the well layers are laminated in the order of the barrier+well+barrier+ . . . +barrier layer. Thus, 11 undoped barrier layers and 10 well layers among which the initial 2 layers are doped with Si and the remaining 8 layers are undoped are laminated alternately, in 21 layers in all, with the result that the active layer 7 in the multiquantum-well structure having a total thickness of 2500 angstroms is obtained.

For the resulting LED device, the blue emission at a wavelength of 470 nm is observed at the forward voltage of 20 mA. Vf is 3.4V and the light output power is 6.4 mW.

Example 3

The LED device is fabricated in the same manner as in Example 1, except that the active layer 7 is formed in the following manner.

(Active Layer 7)

A barrier layer made of undoped GaN is grown to the thickness of 200 angstroms using TMG and ammonia. Subsequently, at 800° C., a well layer made of $In_{0.3}Ga_{0.7}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of undoped $In_{0.3}Ga_{0.7}N$ is grown to the thickness of 30 angstroms. Then, the barrier layers and the well layers are laminated in the order of the barrier+well+barrier+ . . . +barrier layer. Thus, 6 undoped barrier layers and 5 well layers among which the initial layer is doped with Si and the remaining 4 layers are undoped are laminated alternately, in 11 layers in all, with the result that the active layer 7 in the multi-quantum-well structure having a total thickness of 1350 angstroms is obtained.

For the resulting LED device, the blue emission at a wavelength of 470 nm is observed at the forward voltage of 20 mA. Vf is 3.4V and the light output power is 6.3 mW.

Example 4

The LED device is fabricated in the same manner as in Example 1, except that the active layer 7 is formed in the following manner.

(Active Layer 7)

A barrier layer made of undoped GaN is grown to the thickness of 200 angstroms using TMG and ammonia. Subsequently, at 800° C., a well layer made of $In_{0.3}Ga_{0.7}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of undoped $In_{0.3}Ga_{0.7}N$ is grown to the thickness of 30 angstroms. Then, the barrier layers and the well layers are laminated in the order of the barrier+well+barrier+ . . . +barrier layer. Thus, 3 undoped barrier layers and 2 well layers among which the initial layer is doped with Si and the remaining layer is undoped are laminated alternately, in 5 layers in all, with the result that the active layer 7 in the multi-quantum-well structure having a total thickness of 660 angstroms is obtained.

For the resulting LED device, the blue emission at a wavelength of 470 nm is observed at the forward voltage of 20 mA. Vf is 3.4V and the light output power is 6.2 mW.

Example 5

The LED device is fabricated in the same manner as in Example 1, except that the active layer 7 is formed in the following manner.
(Active Layer 7)

A barrier layer made of GaN doped with Si to $5\times10^{17}/cm^3$ is grown to the thickness of 200 angstroms using TMG, ammonia and silane gas. Subsequently, at 800° C., a well layer made of undoped $In_{0.3}Ga_{0.7}N$ is grown to the thickness of 30 angstroms using TMG, TMI and ammonia. Further, a barrier layer made of GaN doped with Si to $5\times10^{17}/cm^3$ is grown to the thickness of 200 angstroms and a well layer made of undoped $In_{0.3}Ga_{0.7}N$ is grown to the thickness of 30 angstroms. Then, the barrier layers and the well layers are laminated in the order of the barrier+well+barrier+ . . . +barrier layer. Thus, 16 barrier layers among which the initial 3 layers are doped with Si and the remaining 13 layers are undoped and 15 undoped well layers are laminated alternately, in 31 layers in all, with the result that the active layer 7 in the multi-quantum-well structure having a total thickness of 3650 angstroms is obtained.

For the resulting LED device, the blue emission at a wavelength of 470 nm is observed at the forward voltage of 20 mA. Vf is 3.6V and the light output power is 6.2 mW.

Example 6

The LED device is fabricated in the same manner as in Example 1, except that the active layer 7 is formed in the following manner.
(Active Layer 7)

A barrier layer made of GaN doped with Si to $5\times10^{17}/cm^3$ is grown to the thickness of 200 angstroms using TMG, ammonia and silane gas. Subsequently, at 800° C., a well layer made of $In_{0.3}Ga_{0.7}N$ doped with Si to $5\times10^{17}/cm^3$ is grown to the thickness of 30 angstroms using TMG, TMI, ammonia and silane gas. Further, a barrier layer made of GaN doped with Si to $5\times10^{17}/cm^3$ is grown to the thickness of 200 angstroms and a well layer made of $In_{0.3}Ga_{0.7}N$ doped with Si to $5\times10^{17}/cm^3$ is grown to the thickness of 30 angstroms. Then, the barrier layers and the well layers are laminated in the order of the barrier+well+barrier+ . . . +barrier layer. Thus, 16 barrier layers among which the initial 3 layers are doped with Si and the remaining 13 layers are undoped and 15 well layers among which the initial 3 layers are doped with Si and the remaining 12 layers are undoped are laminated alternately, in 31 layers in all, with the result that the active layer 7 in the multi-quantum-well structure having a total thickness of 3650 angstroms is obtained.

For the resulting LED device, the blue emission at a wavelength of 470 nm is observed at the forward voltage of 20 mA. Vf is 3.6V and the light output power is 6.4 mW.

Example 7

The LED device is fabricated in the same manner as in Example 1, except that the active layer 7 is formed in the following manner.
(Active Layer 7)

A barrier layer made of GaN doped with Si to $5\times10^{17}/cm^3$ is grown to the thickness of 200 angstroms using TMG, ammonia and silane gas. Subsequently, at 800° C., a well layer made of $In_{0.3}Ga_{0.7}N$ doped with Si to $5\times10^{17}/cm^3$ is grown to the thickness of 30 angstroms using TMG, TMI, ammonia and silane gas. Further, a barrier layer made of GaN doped with Si to $5\times10^{17}/cm^3$ is grown to the thickness of 200 angstroms and a well layer made of $In_{0.3}Ga_{0.7}N$ doped with Si to $5\times10^{17}/cm^3$ is grown to the thickness of 30 angstroms. Then, the barrier layers and the well layers are laminated in the order of the barrier+well+barrier+ . . . +barrier layer. Thus, 11 barrier layers among which the initial 2 layers are doped with Si and the remaining 9 layers are undoped and 10 well layers among which the initial 2 layers are doped with Si and the remaining 8 layers are undoped are laminated alternately, in 21 layers in all, with the result that the active layer 7 in the multi-quantum-well structure having a total thickness of 3650 angstroms is obtained.

For the resulting LED device, the blue emission at a wavelength of 470 nm is observed at the forward voltage of 20 mA. Vf is 3.6V and the light output power is 6.2 mW.

Example 8

The LED device is fabricated in the same manner as in Example 1, except that the active layer 7 is formed in the following manner.
(Active Layer 7)

A barrier layer made of GaN doped with Si to $5\times10^{17}/cm^3$ is grown to the thickness of 200 angstroms using TMG, ammonia and silane gas. Subsequently, at 800° C., a well layer made of $In_{0.3}Ga_{0.7}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of undoped $In_{0.3}Ga_{0.7}N$ is grown to the thickness of 30 angstroms. Then, the barrier layers and the well layers are laminated in the order of the barrier+well+barrier+ . . . +barrier layer. Thus, 11 barrier layers among which the initial layer is doped with Si and the remaining 9 layers are undoped and 10 well layers among which the initial 1 layer is doped with Si and the remaining 8 layers are undoped are laminated alternately, in 21 layers in all, with the result that the active layer 7 in the multi-quantum-well structure having a total thickness of 3650 angstroms is obtained.

For the resulting LED device, the blue emission at a wavelength of 470 nm is observed at the forward voltage of 20 mA. Vf is 3.6V and the light output power is 6.0 mW.

Example 9

The LED device is fabricated in the same manner as in Example 1, except that the active layer 7 is formed in the following manner.
(Active Layer 7)

A barrier layer made of GaN doped with Si to $5\times10^{17}/cm^3$ is grown to the thickness of 200 angstroms using TMG, ammonia and silane gas. Subsequently, at 800° C., a well layer made of undoped $In_{0.3}Ga_{0.7}N$ is grown to the thickness of 30 angstroms using TMG, TMI and ammonia. Further, a barrier layer made of undoped GaN is grown to the thickness of 200 angstroms, with the result that the active layer 7 in the multi-quantum-well structure is obtained.

For the resulting LED device, the blue emission at a wavelength of 470 nm is observed at the forward voltage of 20 mA. Vf is 3.4V and the light output power is 5.6 mW.

Example 10

Each layer down to the n-type contact layer 4 is formed in the same manner as in Example 1.

(Second Undoped GaN Layer 5)

Next, the silane gas is stopped and at 1050° C., in the same manner, the second undoped GaN layer 5 is grown to the thickness of 1500 angstroms.

(n-Type Multi-layered Film 6)

Next, at 800° C., using TMG, TMI and ammonia, a second nitride semiconductor layer made of undoped $In_{0.03}Ga_{0.97}N$ is grown to the thickness of 20 angstroms. Subsequently, the temperature is raised and a first nitride semiconductor layer made of undoped GaN is grown to the thickness of 40 angstroms. These operations are repeated to laminate alternately the layers in the order of the second layer+the first layer, in 10 layers, respectively. Finally, the second nitride semiconductor layer made of GaN is grown to the thickness of 40 angstroms. Thus, an n-type multilayered film 6 in the super lattice structure is grown to the thickness of 640 angstroms.

The active layer 7 and the remaining layers below the active layer 7 are formed in the same manner as in Example 1 to fabricate a LED device. Thus, there are provided the said n-side first multi-layered film 5 and the n-side second multi-layered film 6 between the contact layer and the active layer, with the result that the withstand static voltage is further improved.

For the resulting LED device, the blue emission at a wavelength of 470 nm is observed at the forward voltage of 20 mA. Vf is 3.6V and the light output power is 6.5 mW.

Example 11

The LED device is fabricated in the same manner as in Example 1, except that the second undoped GaN layer 5 and the n-type multi-layered film 6 are omitted.

For the resulting LED device, the blue emission at a wavelength of 470 nm is observed at the forward voltage of 20 mA. Vf is 3.8V and the light output power is 6.2 mW.

Example 12

The LED device is fabricated in the same manner as in Example 1, except that the layer as will be described in the following part is formed between the p-type multi-layered film 8 and the p-type contact layer 9.

(p-Type Undoped AlGaN Layer)

After formation of the p-type multi-layered film, an undoped $Al_{0.05}Ga_{0.95}N$ layer is grown to the thickness of 2000 angstroms. This layer contains a p-type impurity due to the diffusion of Mg from the p-type multi-layered film 8 and shows a p-type conductivity.

For the resulting LED device, the blue emission at a wavelength of 470 nm is observed at the forward voltage of 20 mA. Vf is 3.4V and the light output power is 6.5 mW.

Example 13

The LED device is fabricated in the same manner as in Example 3, except that the active layer 7 is formed in the following manner.

(Active Layer 7)

A barrier layer made of undoped GaN is grown to the thickness of 200 angstroms using TMG and ammonia. Subsequently, at 800° C., a well layer made of $In_{0.35}Ga_{0.65}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of undoped $In_{0.35}Ga_{0.65}N$ is grown to the thickness of 30 angstroms. Then, the barrier layers and the well layers are laminated in the order of the barrier+well+barrier+ . . . +barrier layer. Thus, 6 undoped barrier layers and 5 well layers among which the initial 1 layer is doped with Si and the remaining 4 layers are undoped are laminated alternately, in 11 layers in all, with the result that the active layer 7 in the multi-quantum-well structure having a total thickness of 1350 angstroms is obtained.

For the resulting LED device, the blue-green emission at a wavelength of 500 nm is observed at the forward voltage of 20 mA. Vf is 3.8V and the light output power is 5.2 mW.

Example 14

The LED device is fabricated in the same manner as in Example 1, except that the active layer 7 is formed in the following manner.

(Active layer 7)

A barrier layer made of undoped GaN is grown to the thickness of 200 angstroms using TMG and ammonia. Subsequently, at 800° C., a well layer made of $In_{0.40}Ga_{0.60}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of undoped $In_{0.40}Ga_{0.60}N$ is grown to the thickness of 30 angstroms. Then, the barrier layers and the well layers are laminated in the order of the barrier+well+barrier+ . . . +barrier layer. Thus, 5 undoped barrier layers and 4 well layers among which the initial 1 layer is doped with Si and the remaining 3 layers are undoped are laminated alternately, in 9 layers in all, with the result that the active layer 7 in the multi-quantum-well structure having a total thickness of 1120 angstroms is obtained.

For the resulting LED device, the blue-green emission at a wavelength of 530 nm is observed at the forward voltage of 20 mA. Vf is 3.5V and the light output power is 3.6 mW.

Example 15

The LED device is fabricated in the same manner as in Example 1, except that the second n-type multi-layered film 6 is omitted. The resulting LED device showed a little worse device characteristics and a lower light output power as compared with in Example 1. But the light output power thereof is better than that of the conventional LED device.

Example 16

The LED device is fabricated in the same manner as in Example 1, except that The thickness of the buffer layer 2 is 150 angstroms and the thickness of the first undoped GaN layer 3 is 1.5 μm. The similar results to those in Example 1 are obtained.

Example 17

The LED device is fabricated in the same manner as in Example 13, except that The thickness of the buffer layer 2 is 150 angstroms and the thickness of the first undoped GaN layer 3 is 1.5 μm. The similar results to those in Example 13 are obtained.

Example 18

The LED device is fabricated in the same manner as in Example 1, except that the active layer 7 is formed in the following manner.

(Active layer 7)

A barrier layer made of undoped GaN is grown to the thickness of 200 angstroms using TMG and ammonia. Subsequently, at 800° C., a well layer made of $In_{0.30}Ga_{0.70}N$ doped with Si to $5\times10^{17}/cm^3$ is grown to the thickness of 30 angstroms using TMG, TMI, ammonia and silane gas. Further, a barrier layer made of undoped GaN is grown to the thickness of 200 angstroms and a well layer made of $In_{0.30}Ga_{0.70}N$ doped with Si to $5\times10^{17}/cm^3$ is grown to the thickness of 30 angstroms. Furthermore, a barrier layer made of undoped GaN is grown to the thickness of 200 angstroms and a well layer made of $In_{0.30}Ga_{0.70}N$ doped with Si to $5\times10^{17}/cm^3$ is grown to the thickness of 30 angstroms. Then, the barrier layers and the well layers are laminated in the order of the barrier+well+barrier+ . . . +barrier layer. Thus, 16 undoped barrier layers and 15 well layers among which the initial 3 layers are doped with Si and the remaining 12 layers are undoped are laminated alternately, in 31 layers in all, with the result that the active layer 7 in the multi-quantum-well structure having a total thickness of 3650 angstroms is obtained.

Thus, the active layer is formed in such a structure that the farther the Si doped layer is from the n-type layer, the smaller the amount of doped Si is in said layer, with the result that the similar results to those in Example 1 are obtained.

Industrial Applicability

According to the present invention, the layers in the n-type layer region of the active layer in the multiquantum-well structure composed of a well layer and a barrier layer are doped with Si and the doped layers are limited. The supply of the donor from the n-type layer can be compensated for, resulting in the nitride semiconductor device having a high light output power. Therefore, the nitride semiconductor devices according to the present invention can be applied effectively to not only light emitting devices such as light emitting diodes (LEDs) and laser diodes (LDs), but also solar cells, light receiving devices such as optical sensors and electronic devices such as transistors and power devices.

What is claimed is:

1. A nitride semiconductor device which comprises an active layer containing an n-type impurity and comprising a quantum well layer or layers and a barrier layer or layers between n-type nitride semiconductor layers and p-type nitride semiconductor layers, wherein at least said quantum well layer at the proximate side in said active layer to said n-type nitride semiconductor layers is doped with an n-type impurity and wherein at least said quantum well layer at the proximate side in said active layer to said p-type nitride semiconductor layers is not doped with an n-type impurity.

2. A nitride semiconductor device according to claim 1, wherein said active layer is a MQW structure having (i) laminated layers and at least one of 1st to j-th layers counting from the side proximate to said n-type nitride semiconductor layers is doped with n-type impurity; wherein $j'=i/6+2$ where i is an integer of at least 4, and wherein j is the integer portion of j'.

3. A nitride semiconductor device according to claim 1, wherein said active layer contains an n-type impurity and comprises an MQW structure comprising quantum well layers and barrier layers between n-type nitride semiconductor layers and p-type nitride semiconductor layers, wherein at least said quantum well layer at the proximate side in said active layer to said n-type nitride semiconductor layers is doped with an n-type impurity and at least said quantum well layer at the proximate side in said active layer to said n-type nitride semiconductor layers is doped with an n-type impurity, and
wherein said barrier layer and/or said quantum well layer at the proximate side to said p-type semiconductor layers are not doped with n-type impurity.

4. A nitride semiconductor device according to claim 1, wherein said active layer contains an n-type impurity and comprises an MQW structure comprising quantum well layers and barrier layers between n-type nitride semiconductor layers and p-type nitride semiconductor layers, wherein at least said quantum well layer and said barrier layer at the proximate side in said active layer to said n-type nitride semiconductor layers are doped with n-type impurity and wherein at least said quantum well layer and said barrier layer at the proximate side in said active layer to said p-type nitride semiconductor layers are not doped with n-type impurity.

5. A nitride semiconductor device according to claim 1, wherein said active layer is a MQW structure comprising a quantum well layer and barrier layer pairs sandwiching said quantum well layer, wherein said barrier layer at the proximate side to said n-type nitride semiconductor layers are doped with n-type impurity, and said quantum well layer and said barrier layer at the proximate side to said p-type semiconductor nitride layers are not doped with n-type impurity.

6. A nitride semiconductor device according to claim 1, wherein said active layer comprises 9 to 15 layers, at most 4 layers of which, counting from the proximate side to said n-type semiconductor layers, are doped with n-type impurity.

7. A nitride semiconductor device according to claim 1, wherein said quantum well layers in said active layer comprises $In_xGa_{1-x}N$ (0<x<1) which is able to emit or receive a peak wavelength belonging to a range of 470 to 530 nm.

8. A nitride semiconductor device according to claim 1, wherein said n-type impurity is selected from the group consisting of Si, Ge and Sn.

9. A nitride semiconductor device according to claim 8, wherein said n-type impurity is Si.

10. A nitride semiconductor device according to claim 1, wherein said n-type impurity content of said active layer is lower than that of said n-type nitride semiconductor layers.

11. A nitride semiconductor device according to claim 1, wherein the n-type impurity content of the active layer decreases as the distance from said n-type nitride semiconductor layers increases.

12. A nitride semiconductor device according to claim 1, wherein the n-type impurity content of said active layer is in a range of $5\times10^{16}$ to $2\times10^{18}/cm^3$.

13. A nitride semiconductor device according to claim 12, wherein the n-type impurity content of said barrier layer in said active layer is in a range of $5\times10^{16}$ to $2\times10^{18}/cm^3$.

14. A nitride semiconductor device according to claim 12, wherein the n-type impurity content of said quantum well layer in said active layer is in a range of $5\times10^{16}$ to $2\times10^{18}/cm^3$.

15. A nitride semiconductor device according to claim 9, wherein the n-type impurity content of said barrier layer in said active layer is in a range of $5\times10^{16}$ to $2\times10^{18}/cm^3$, whereas the n-type impurity content of said quantum well layer in said active layer is in a range of $5\times10^{16}$ to $2\times10^{18}/cm^3$ and lower than that of said barrier layer.

16. A nitride semiconductor device according to claim 9, wherein the n-type impurity content of said barrier layer in said active layer is in a range of $5\times10^{16}$ to $2\times10^{18}$/cm$^3$, whereas the n-type impurity content of said quantum well layer in said active layer is less than $5\times10^{16}$ to $2\times10^{18}$/cm$^3$ and lower than that of said barrier layer.

17. A nitride semiconductor device according to claim 2, wherein the thickness of said barrier layer or quantum well layer close or proximate to said n-type semiconductor layers is larger than that of said barrier layer or quantum well layer close or proximate to said p-type semiconductor layers.

18. A nitride semiconductor device according to claim 2, wherein the thickness of said barrier layer or quantum well layer close or proximate to said n-type semiconductor layers is smaller than that of said barrier layer or quantum well layer close or proximate to said p-type semiconductor layers.

19. A nitride semiconductor emitting device which comprises an active layer comprising quantum well layer or layers and barrier layer or layers between n-type nitride semiconductor layers and p-type nitride semiconductor layers, wherein said quantum layer in said active layer comprises InxGa1–xN (0<x<1) having a peak wavelength of 450 to 540 nm and said active layer comprises laminating layers of 9 to 13, in which at most 3 layers from the side of said n-type nitride semiconductor layers are doped with an n-type impurity selected from the group consisting of Si, Ge and Sn at a range of $5\times10^{16}$ to $2\times10^{18}$/cm$^3$, and the other layers are not doped with an n-type impurity.

20. A nitride semiconductor emitting device according to claim 19, wherein the thickness of said barrier layer or quantum well layer close or proximate to said n-type semiconductor layers is larger than that of said barrier layer or quantum well layer proximate to said p-type semiconductor layers.

21. A nitride semiconductor emitting device according to claim 19, wherein the thickness of said barrier layer or quantum well layer close or proximate to said n-type semiconductor layers is smaller than that of said barrier layer or quantum well layer close or proximate to said p-type semiconductor layers.

22. A nitride semiconductor emitting device according to claim 19, wherein said n-type impurity is Si.

23. A nitride semiconductor emitting device according to claim 19, wherein said quantum well layer in said active layer comprises In$_x$Ga$_{1-x}$N (0<x<1) having a peak wavelength of 490 to 510 nm.

24. A nitride semiconductor emitting device according to claim 23, wherein said barrier layer in said active layer comprises In$_y$Ga$_{1-y}$N (0≦y<1, y<x).

25. A nitride semiconductor emitting device according to claim 19, wherein said active layer comprises an MQW of In$_x$Ga$_{1-x}$N (0<x<1)/In$_y$Ga$_{1-y}$N (0≦y<1, y<x) lamination and is formed on an n-type multi-layer.

26. A nitride semiconductor emitting device according to claim 25, wherein said multi-layer is a buffer super lattice layer undoped with n-type impurity and comprising In$_z$Ga$_{1-z}$N (0<z<1)/GaN lamination or Al$_w$Ga$_{1-w}$N (0<w<1)/GaN lamination.

27. A nitride semiconductor emitting device according to claim 26, wherein said GaN layer of said buffer super lattice layer has a thickness of less than 70 Å and said barrier layer of said active layer has a thickness of more than 70 Å.

28. A nitride semiconductor emitting device according to claim 27, wherein said multi-layer are doped with n-impurity and comprises lamination of GaN layer and a layer selected from the group consisting of a In$_z$Ga$_{1-z}$ (0<z<1, z<y) layer having a larger band gap energy than that of said quantum well layer and a Al$_w$Ga$_w$N (0<w<1) layer.

29. A nitride semiconductor emitting device according to claim 28, wherein said n-type impurity for doping into said active layer and said n-type clad layer is Si and the Si content of said active layer is in a range of $5\times10^{16}$ to $2\times10^{18}$/cm$^3$ whereas the Si content of said n-clad layer is in a range of more than $5\times10^{17}$/cm$^3$ and larger than that of said active layer.

30. A nitride semiconductor emitting device according to claim 19, wherein the first layer form the side of said n type nitride semiconductor layers is doped with the n type impurity and the other layers are not doped with the n type impurity.

31. A nitride semiconductor emitting device according to claim 6, wherein the first and second layers from the side of said n type nitride semiconductor layers are doped with the n type impurity.

* * * * *